United States Patent
Sugihara

(10) Patent No.: US 7,468,303 B2
(45) Date of Patent: Dec. 23, 2008

(54) SEMICONDUCTOR DEVICE AND MANUFACTURING METHOD THEREOF

(75) Inventor: Shigeyuki Sugihara, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 151 days.

(21) Appl. No.: 10/954,370

(22) Filed: Oct. 1, 2004

(65) Prior Publication Data

US 2005/0104135 A1 May 19, 2005

(30) Foreign Application Priority Data

Oct. 2, 2003 (JP) ............................. 2003-344170

(51) Int. Cl.
*H01L 21/336* (2006.01)
(52) U.S. Cl. .................... 438/305; 438/306
(58) Field of Classification Search ......... 438/581–583, 438/592, 305–306
See application file for complete search history.

(56) References Cited

U.S. PATENT DOCUMENTS

| | | | | |
|---|---|---|---|---|
| 4,949,136 A | * | 8/1990 | Jain | ............................ 257/344 |
| 5,183,771 A | * | 2/1993 | Mitsui et al. | ................. 438/302 |
| 5,208,472 A | * | 5/1993 | Su et al. | ...................... 257/344 |
| 5,493,142 A | * | 2/1996 | Randazzo et al. | ........... 257/328 |
| 6,100,125 A | * | 8/2000 | Hulfachor et al. | ........... 438/224 |
| 6,888,191 B2 | | 5/2005 | Aoki | |

FOREIGN PATENT DOCUMENTS

| | | |
|---|---|---|
| JP | 2002-164536 | 6/2002 |
| JP | 2002-353330 | 12/2002 |
| JP | 2003-151991 A | 5/2003 |
| KR | 2003-0058437 A | 7/2003 |

\* cited by examiner

*Primary Examiner*—Theresa T Doan
(74) *Attorney, Agent, or Firm*—Morrison & Foerster LLP

(57) ABSTRACT

Junction leakage in a medium voltage MOS transistor having a silicide structure is prevented. A titanium layer is formed by sputtering titanium over the entire surface of a semiconductor substrate. A gate electrode makes contact with the titanium layer through an opening and $P^+$-type diffusion layers make contact with the titanium layer through openings. In subsequent heat treatment, portions of the titanium layer contacting the gate electrode or each of the $P^+$-type diffusion layers are changed into silicide, forming titanium silicide layers on the gate electrode and the $P^+$-type diffusion layers. Then the rest of the titanium layer, which is on the silicide block layer and not changed into silicide, is removed by wet-etching.

4 Claims, 6 Drawing Sheets

SEMICONDUCTOR DEVICE AND MANUFACTURING METHOD THEREOF

CROSS-REFERENCE OF THE INVENTION

This invention is based on Japanese Patent Application No. 2003-344170, the content of which is incorporated herein by reference in its entirety.

BACKGROUND OF THE INVENTION

1. Field of the Invention

This invention relates to a semiconductor device and its manufacturing method, specifically to a MOS transistor having a salicide (self aligned silicide) structure and its manufacturing method.

2. Description of the Related Art

A silicide structure as well as a salicide structure has been used to reduce gate resistance and source-drain resistance of a MOS transistor in order to enhance speed of the MOS transistor. FIG. 6 shows a cross-sectional structure of such a MOS transistor.

A gate electrode 52 is formed on an N-type silicon substrate 50 through a gate insulation film 51. A sidewall spacer insulation film 53 is formed on a sidewall of the gate electrode 52. A source layer 54 made of a P$^-$-type diffusion layer 54a and a P$^+$-type diffusion layer 54b and a drain layer 55 made of a P$^-$-type diffusion layer 55a and a P$^+$-type diffusion layer 55b are formed.

Titanium silicide (TiSix) layers 56a, 56b and 56c are formed on the gate electrode 52 and the P$^+$-type diffusion layers 54b and 55b, respectively.

FIG. 7 shows a cross-sectional structure of a MOS transistor having another silicide structure. This MOS transistor is called a medium voltage MOS transistor which has a source withstand voltage and a drain withstand voltage of about 10V. The medium voltage MOS transistor is integrated on the same silicon substrate as the MOS transistor shown in FIG. 6.

A gate electrode 62 is formed on the N-type silicon substrate 50 through a gate insulation film 61, as shown in FIG. 7. A sidewall spacer insulation film 63 is formed on a sidewall of the gate electrode 62. A source layer 64 made of a P$^-$-type diffusion layer 64a and a P$^+$-type diffusion layer 64b, and a drain layer 65 made of a P$^-$-type diffusion layer 65a and a P$^+$-type diffusion layer 65b are formed.

The P$^+$-type diffusion layers 64b and 65b are located away from the gate electrode 62 and the sidewall spacer insulation film 63, while the P$^-$-type diffusion layers 64a and 65a are located adjacent the gate electrode 62. This structure relaxes electric field concentration in the source layer and the drain layer and provides a higher withstand voltage than the transistor structure shown in FIG. 6.

A titanium silicide layer 66a is formed on the gate electrode 62, a titanium silicide layer 66b is formed on the P$^-$-type diffusion layer 64a and the P$^+$-type diffusion layer 64b, and a titanium silicide layer 66c is formed on the P$^-$-type diffusion layer 65a and the P$^+$-type diffusion layer 65b.

Further description on a MOS transistor having a silicide structure is found, for example, in Japanese Patent Application Publication No. 2002-353330.

Since the P$^+$-type diffusion layers 64b and 65b are located away from the gate electrode 62 in the structure of the MOS transistor shown in FIG. 7, the P$^-$-type diffusion layers 64a and 65a are exposed on the surface of the N-type silicon substrate 50. When titanium silicide is formed in this manner, titanium silicide layers 66b and 66c are formed on the P$^-$-type diffusion layers 64a and 65a also. Since titanium absorbs P-type impurities (boron, for example) in the P$^-$-type diffusion layers 64a and 65a during silicide reaction, junction depth of the diffusion layers is reduced to cause junction leakage.

SUMMARY OF THE INVENTION

The invention provides a semiconductor device that includes a semiconductor substrate, a gate electrode disposed on the semiconductor substrate, a sidewall spacer insulation film formed on a sidewall of the gate electrode, a low concentration diffusion layer formed in a surface of the semiconductor substrate adjacent the gate electrode, a high concentration diffusion layer formed in the surface of the semiconductor substrate away from the sidewall spacer insulation film, a first metal silicide layer formed on the gate electrode, and a second metal silicide layer formed on the high concentration diffusion layer such that the second metal silicide layer is not in contact with the low concentration layer.

DETAILED DESCRIPTION OF THE INVENTION

Next, semiconductor devices and their manufacturing method according to the embodiments of this invention will be explained referring to the figures hereinafter.

Figure 1A:
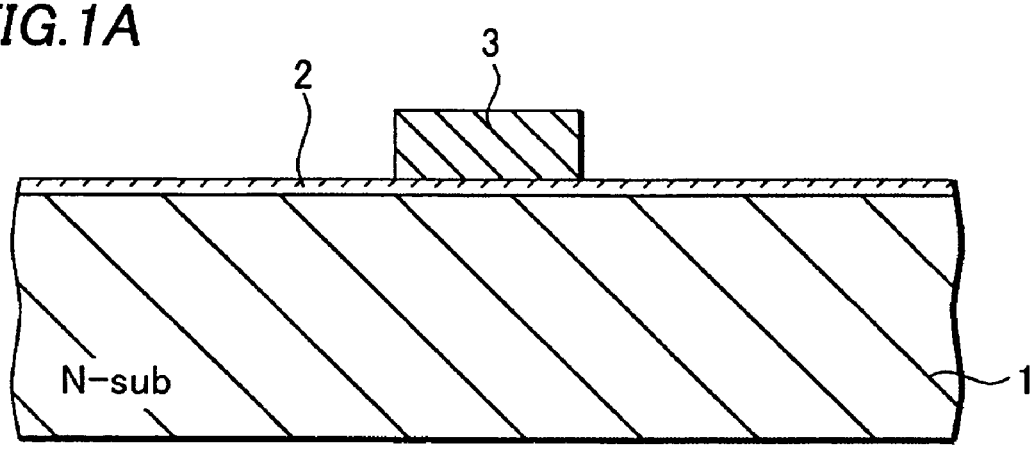
FIGS. 1A, 1B and 1C are cross-sectional views showing a manufacturing method of a semiconductor device according to a first embodiment of this invention.

A first embodiment of this invention will be explained referring to FIGS. 1A-4. FIGS. 1A-3C are cross-sectional views showing the manufacturing method of the semiconductor device, and FIG. 4 is a plan view of the semiconductor device. A gate insulation film 2 made of silicon oxide, for example, is formed on a N-type silicon substrate 1, and a gate electrode 3 made of polysilicon, for example, is formed on the gate insulation film 2, as shown in FIG. 1A.

Figure 1B:
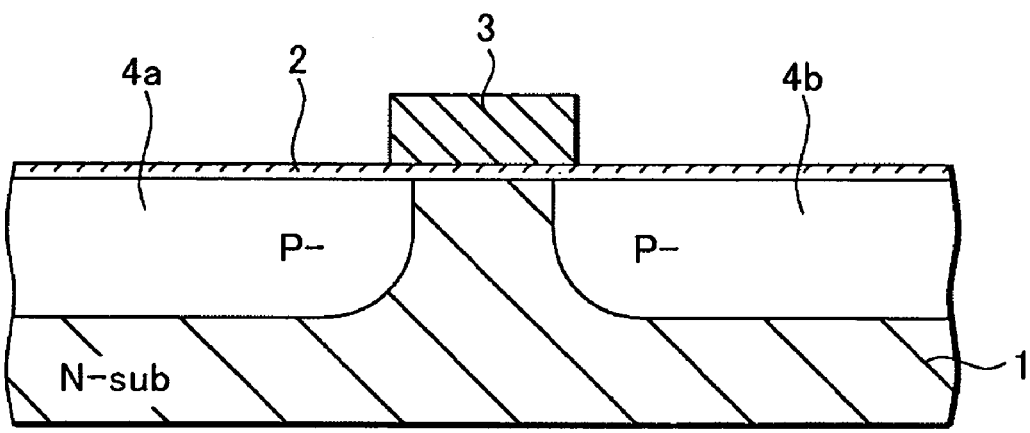

Next, P$^-$-type diffusion layers 4a and 4b are formed adjacent the gate electrode 3 in a surface of the N-type silicon substrate 1, as shown in FIG. 1B. To describe more specifically, low concentration P-type impurity ions such as boron are implanted into the surface of the N-type silicon substrate 1 using the gate electrode as a mask, and then thermal diffusion is performed. The impurity concentration in the P$^-$-type diffusion layers 4a and 4b is about $1\times10^{17}/cm^3$, for example. However, the embodiment is not limited to this concentration.

Figure 1C:
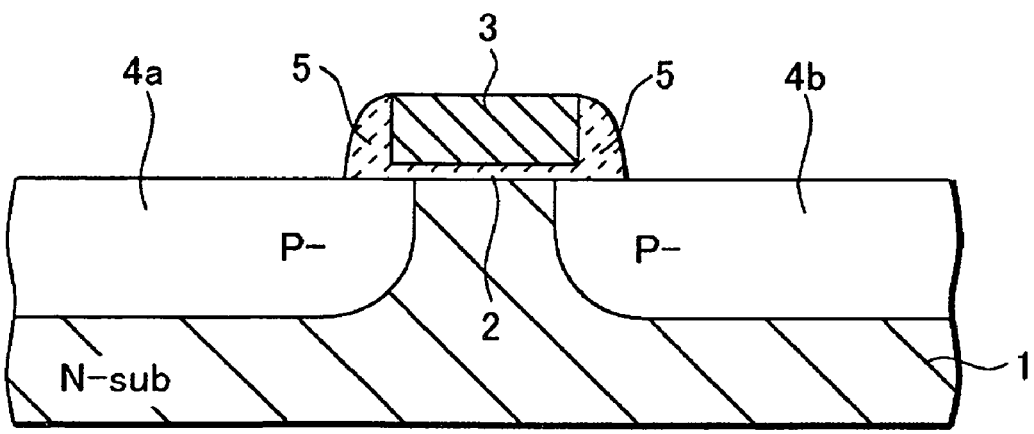

Next, sidewall spacer insulation films 5 are formed on both sides of the gate electrode 3, as shown in FIG. 1C. This process is performed by depositing a silicon oxide film on the entire surface by CVD (Chemical Vapor Deposition) and then etching the silicon oxide film anisotropically. The gate insulation film 2 on the surface of the P⁻-type diffusion layers 4a and 4b is removed in the etching process.

Figure 2A:
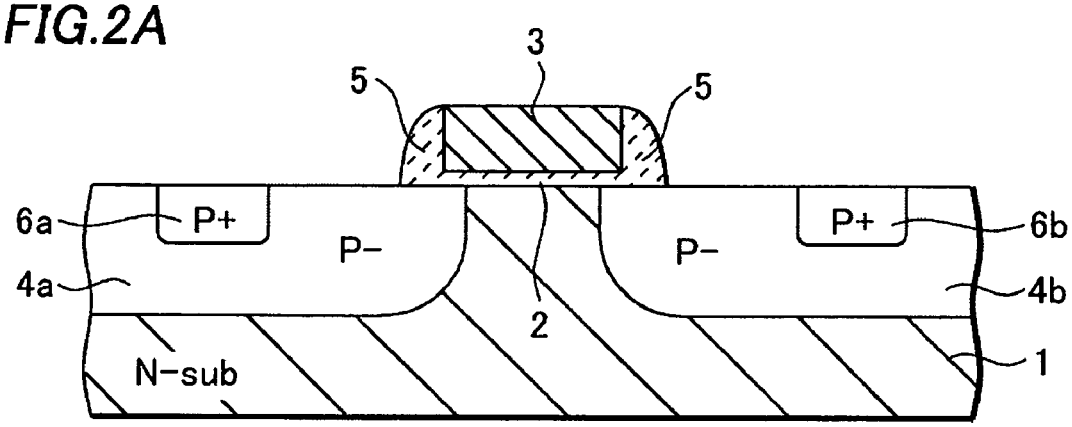
FIGS. 2A, 2B and 2C are cross-sectional views showing the manufacturing method of the semiconductor device according to the first embodiment of this invention.

Next, high concentration P-type impurity ions such as boron are implanted into the surface of the N-type silicon substrate 1 to form P⁺-type diffusion layers 6a and 6b, as shown in FIG. 2A. Each of the P⁺-type diffusion layers 6a and 6b is formed to be located away from the gate electrode 3 by a predetermined distance. As a result, the P⁻-type diffusion layers 4a and 4b are exposed on the surface of the N-type silicon substrate 1 between each of the sidewall spacers 5 and each of the P⁺-type diffusion layers 6a and 6b, respectively. The P⁻-type diffusion layer 4a and the P⁺-type diffusion layer 6a form a source layer while the P⁻-type diffusion layer 4b and the P⁺-type diffusion layer 6b form a drain layer.

Figure 2B:
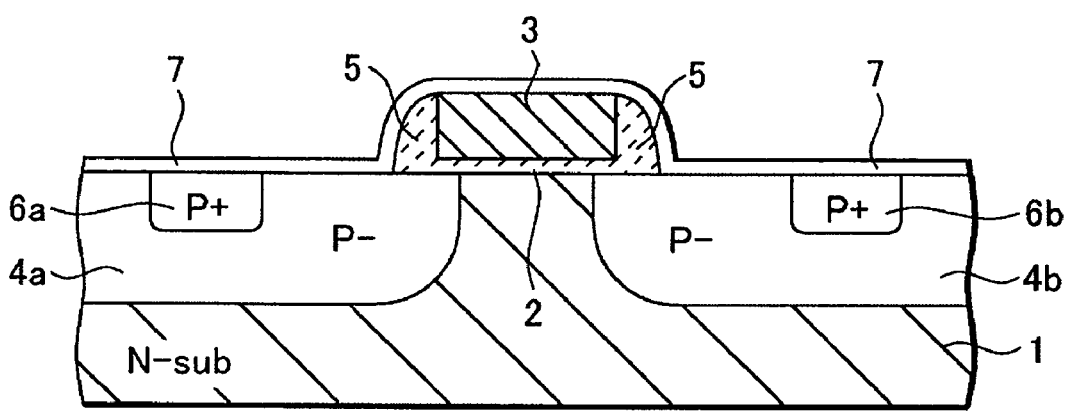
Figure 2C:
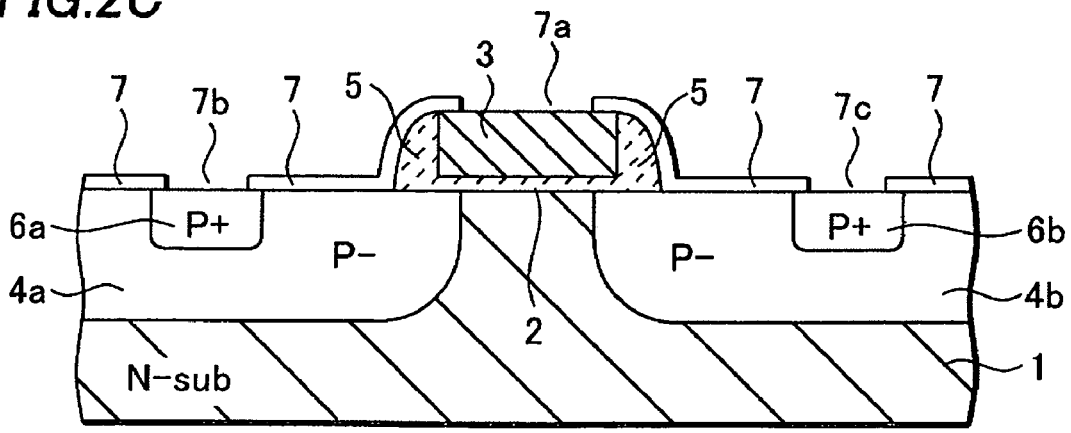

In a subsequent process, a silicide block layer 7 made of silicon oxide film, for example, is deposited on the entire surface as shown in FIG. 2B. By selectively etching the silicide block layer 7, an opening 7a is formed in the silicide block layer 7 on the gate electrode 3, and openings 7b and 7c are formed in the silicide block layer 7 on the P⁺-type diffusion layers 6a and 6b, respectively, as shown in FIG. 2C.

Figure 3A:
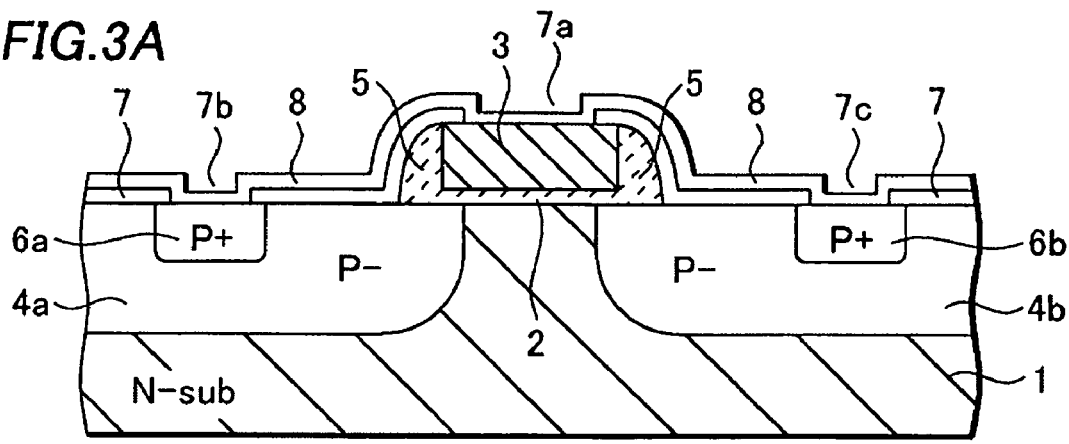
FIGS. 3A, 3B and 3C are cross-sectional views showing the manufacturing method of the semiconductor device according to the first embodiment of this invention.
Figure 4:
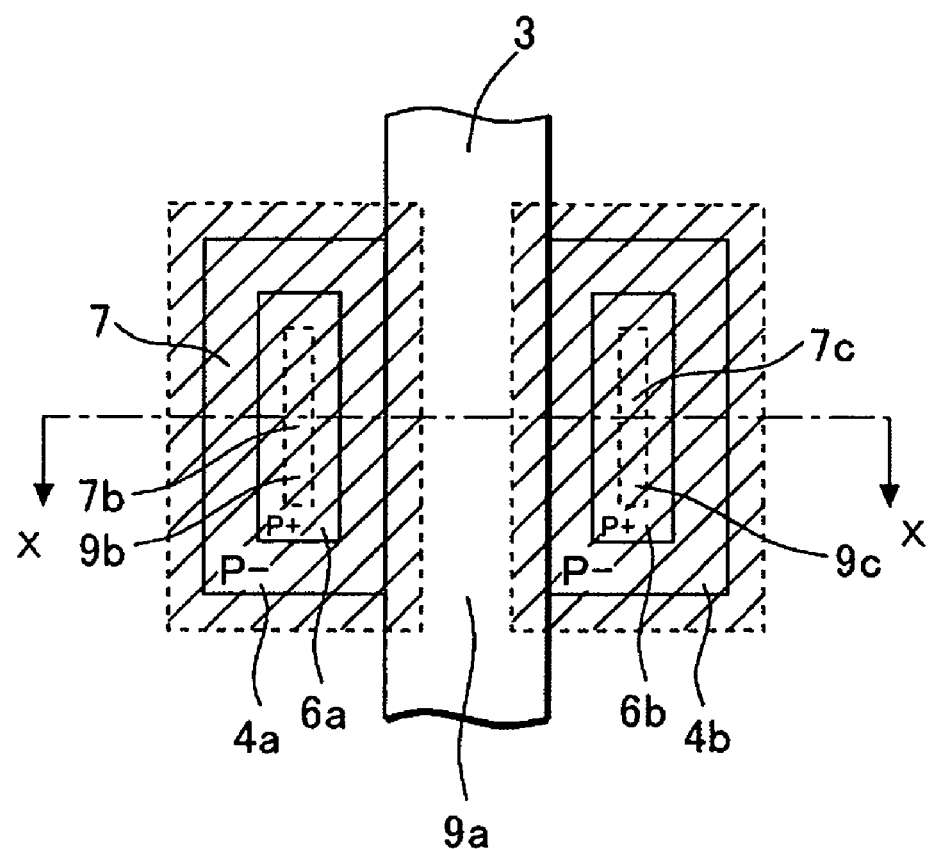
FIG. 4 is a plan view showing the semiconductor device according to the first embodiment of this invention.

Next, a titanium layer 8 is formed by sputtering titanium (Ti) on the entire surface, as shown in FIG. 3A. The gate electrode 3 makes contact with the titanium layer 8 through the opening 7a, and the P⁺-type diffusion layers 6a and 6b make contact with the titanium layer 8 through the openings 7b and 7c.

Figure 3B:
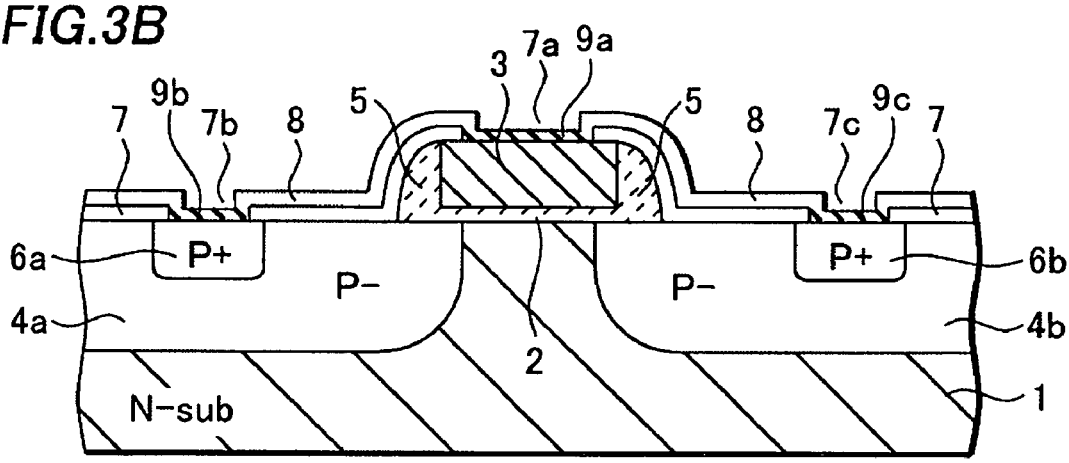

In subsequent heat treatment, portions of the titanium layer 8 contacting the gate electrode 8 and the P⁺-type diffusion layers 6a and 6b are changed into silicide, forming a titanium silicide layer 9a on the surfaces of the gate electrode 3 and forming titanium silicide layers 9b and 9c on the surfaces of the P⁺-type diffusion layers 6a and 6b, respectively, as shown in FIG. 3B.

Figure 3C:
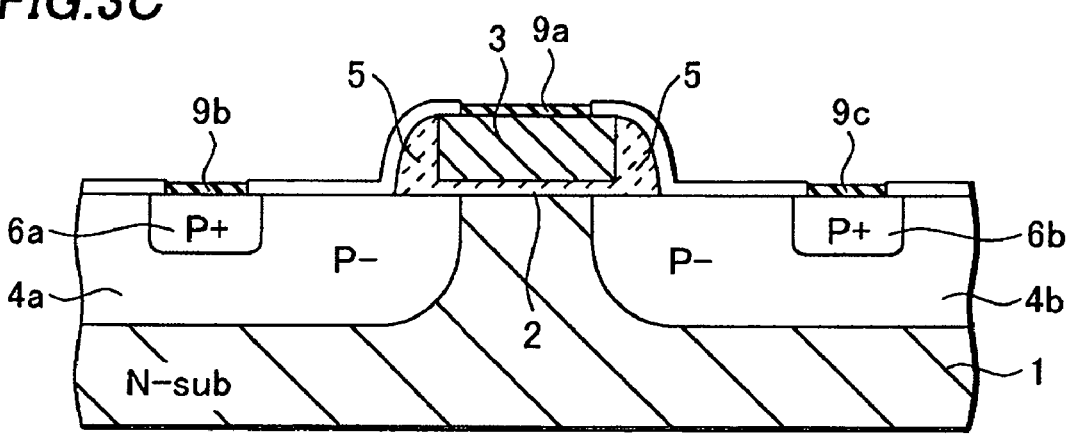

Then the rest of the titanium layer 8, which is on the silicide block layer 7 and not changed into silicide, is removed by wet-etching, as shown in FIG. 3C. FIG. 3C corresponds to a cross-sectional view of a section X-X in a plan view of FIG. 4.

Figure 5A:
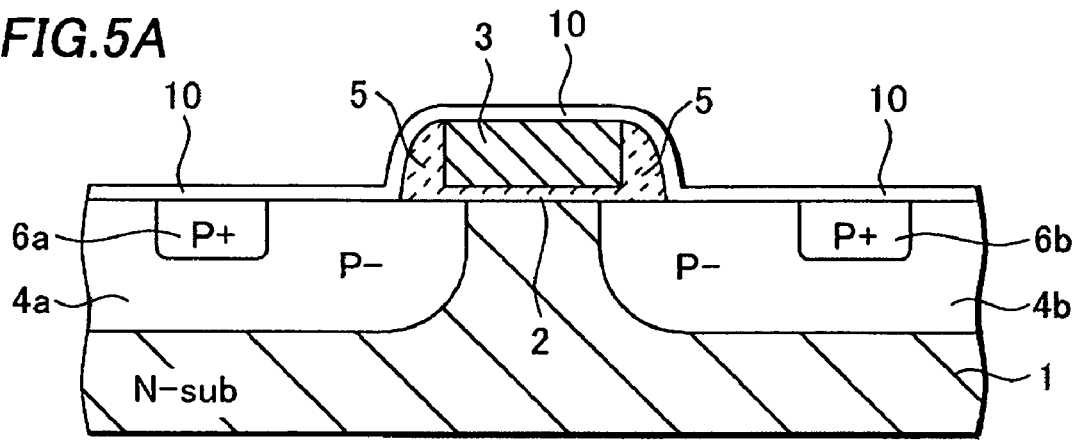
FIGS. 5A, 5B and 5C are cross-sectional views showing a manufacturing method of a semiconductor device according to a second embodiment of this invention.
Figure 5B:
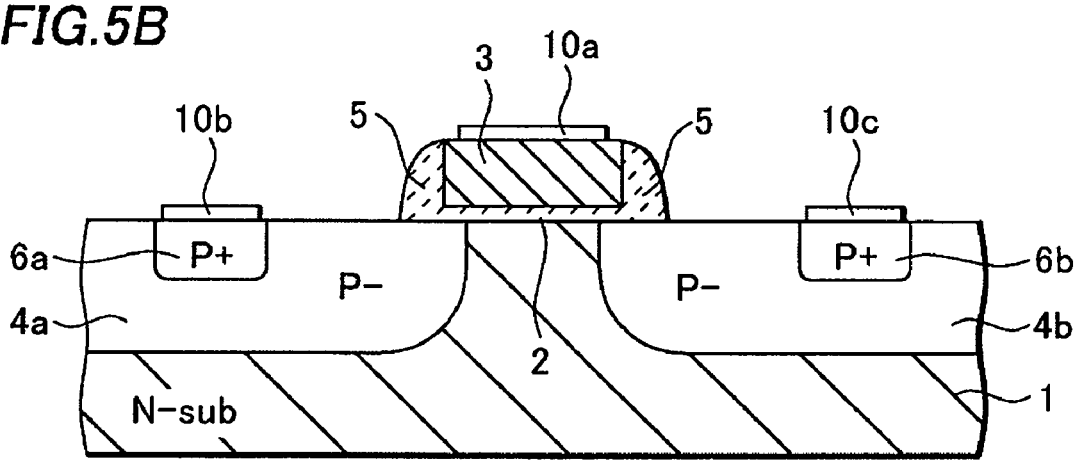
Figure 5C:
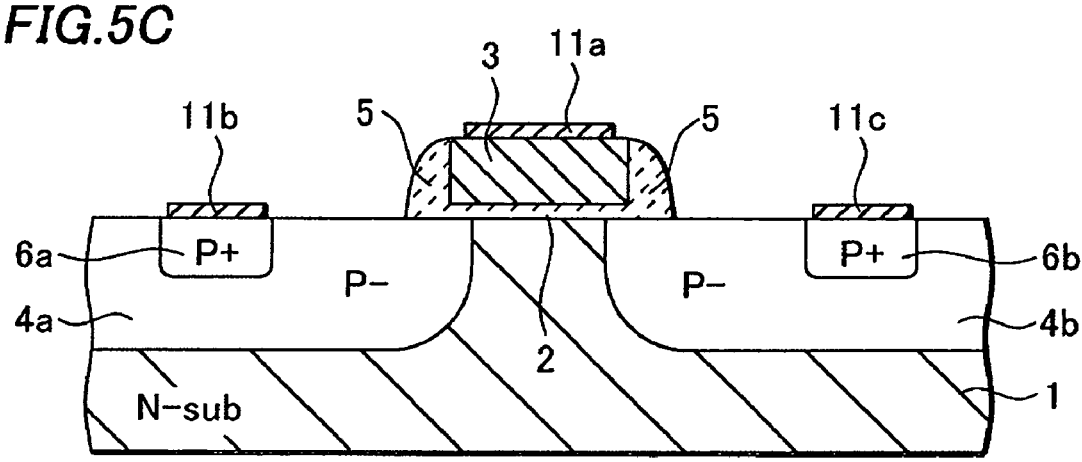
Figure 6:
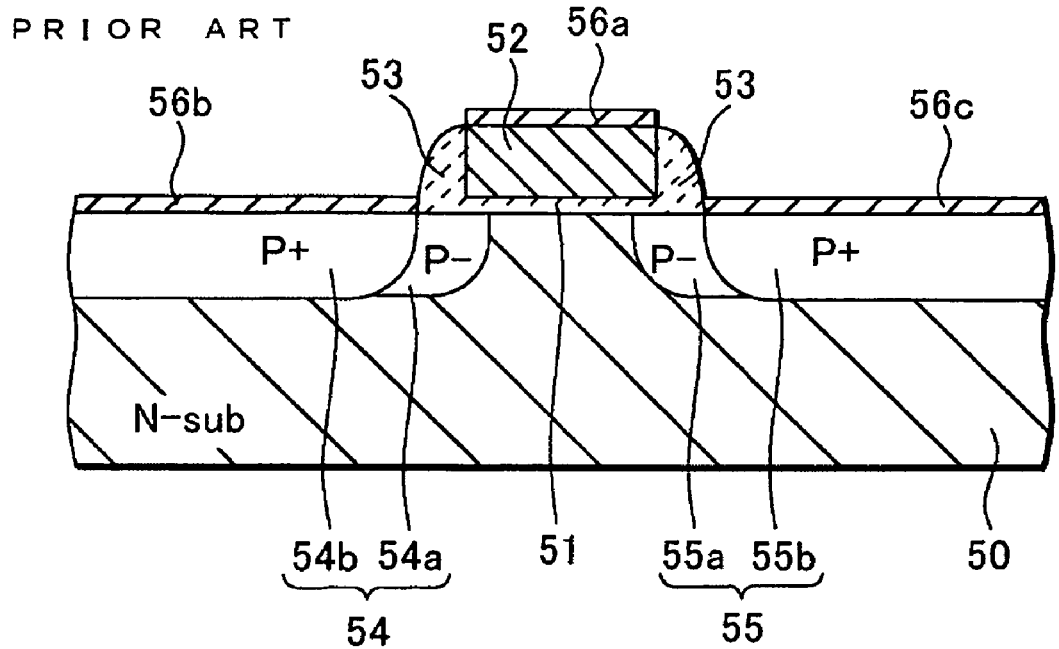
FIG. 6 is a cross-sectional view showing a semiconductor device according to a conventional art.
Figure 7:
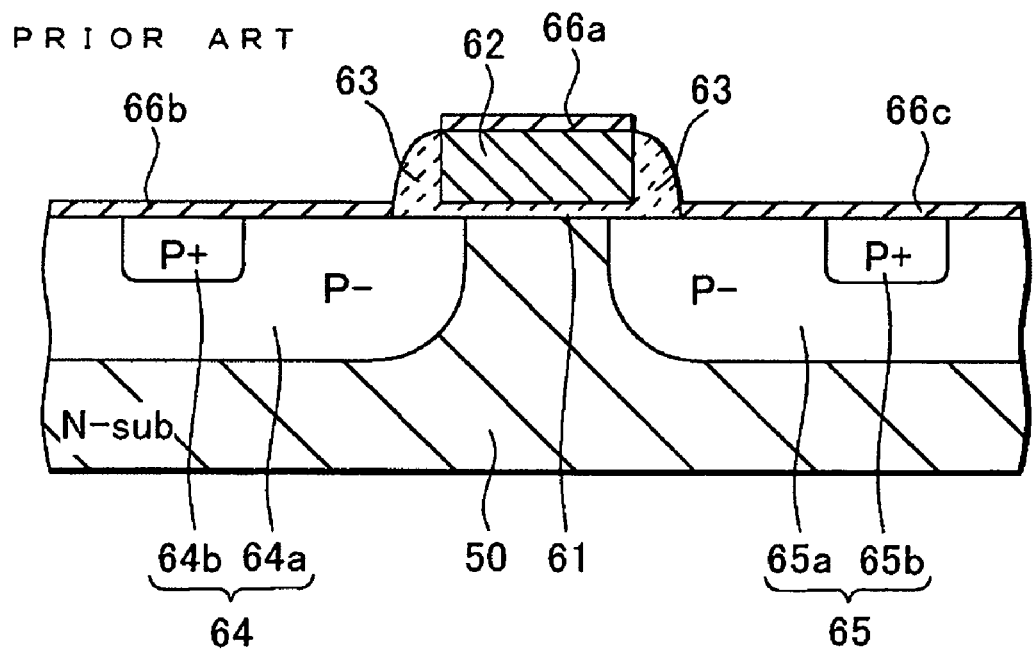
FIG. 7 is a cross-sectional view showing another semiconductor device according to another conventional art.

Next, a second embodiment of this invention will be explained referring to FIGS. 5A-5C. The same reference numerals are used in FIGS. 5A-5C as in FIGS. 1A-4 for the common components, and their detailed explanations are omitted. A titanium layer 10 is formed over the entire surface of the N-type silicon substrate 1 which has undergone the process steps shown in FIGS. 1A, 1B, 1C and 2A and has the P⁺-type diffusion layers 6a and 6b formed in it.

Then the titanium layer 10 is selectively etched to leave a titanium layer 10a on the gate electrode 3 and titanium layers 10a and 10b on the P⁺-type diffusion layers 6a and 6b. The rest of the titanium layer 10 is removed, as shown in FIG. 5B. After that, the titanium layers 10a, 10b and 10c are changed into silicide by heat treatment to form titanium silicide layers 11a, 11b and 11c, as shown in FIG. 5C. The horizontal structure of the device of FIG. 5C generally corresponds the plan view of FIG. 4, except that the silicide block layer 7 is not included in this embodiment.

As the silicide block layer 7 in the first embodiment, material other than the silicon oxide film such as a silicon nitride film may be used. Also, other refractory metals may be used instead of titanium in the first and the second embodiments. Furthermore, although a P-channel MOS transistor is used as an example in the explanations of the first and the second embodiments, this invention may be applied to an N-channel MOS transistor as well. Although both of the source layer and the drain layer have the P⁻-type diffusion layer in the first and the second embodiments, only one of the source layer and the drain layer may have the P⁻-type diffusion layer.

Junction leakage in a medium voltage MOS transistor having the silicide structure can be prevented according to this embodiment. As a result, medium voltage MOS transistors and small dimension MOS transistors having a salicide structure can be integrated into a single chip.

What is claimed is:

1. A method of manufacturing a semiconductor device, comprising:

forming a gate insulation film on a semiconductor substrate;

forming a gate electrode on the gate insulation film;

forming a sidewall spacer on a sidewall of the gate electrode;

forming a low concentration diffusion layer in a surface of the semiconductor substrate adjacent the gate electrode;

forming a high concentration diffusion layer in the surface of the semiconductor substrate away from the sidewall spacer;

forming, after the formation of the low and high concentration diffusion layers, a silicide block layer on the surface of the semiconductor substrate and a surface of the gate electrode so that the silicide block layer is in contact with the low concentration diffusion layer and the sidewall spacer;

patterning the silicide block layer so as to expose a portion of the gate electrode and so as to form an opening contained within an lateral area of a top surface of the high concentration diffusion layer to expose a portion of the high concentration diffusion layer, the opening being defined only by a patterned edge of the silicide block layer and being smaller than the lateral area of the top surface of the high concentration diffusion layer;

depositing a metal layer on the surface of the semiconductor substrate and the surface of the gate electrode;

heating the semiconductor substrate so that the metal layer in contact with the exposed portions of the gate electrode and the high concentration diffusion layer becomes a metal silicide; and removing the metal layer to expose the silicide block layer.

2. The method of claim 1, wherein the metal silicide comprises titanium silicide.

3. The method of claim 1, wherein the silicide block layer comprises a silicon oxide film.

4. The method of claim 3, wherein the metal suicide comprises titanium silicide.

* * * * *